(12) United States Patent
Dalton

(10) Patent No.: US 10,229,233 B2
(45) Date of Patent: Mar. 12, 2019

(54) SYSTEM AND METHOD USED IN DESIGN, PRODUCTION AND OPERATION OF METAL FORMING TOOLS

(71) Applicant: Gregory Dalton, Sudbury (CA)

(72) Inventor: Gregory Dalton, Sudbury (CA)

(*) Notice: Subject to any disclaimer, the term of this patent is extended or adjusted under 35 U.S.C. 154(b) by 488 days.

(21) Appl. No.: 14/928,149

(22) Filed: Oct. 30, 2015

(65) Prior Publication Data
US 2016/0048619 A1  Feb. 18, 2016

Related U.S. Application Data

(63) Continuation of application No. PCT/CA2014/000400, filed on May 2, 2014.

(60) Provisional application No. 61/819,044, filed on May 3, 2013.

(51) Int. Cl.
G06F 17/50 (2006.01)
G05B 19/4097 (2006.01)
B21D 22/00 (2006.01)

(52) U.S. Cl.
CPC ..... *G06F 17/5018* (2013.01); *G05B 19/4097* (2013.01); *B21D 22/00* (2013.01); *Y02P 90/265* (2015.11)

(58) Field of Classification Search
CPC ............. G06F 17/5018; G05B 19/4097; Y02P 90/265; B21D 22/00
See application file for complete search history.

(56) References Cited

U.S. PATENT DOCUMENTS 6,353,768 B1 * 3/2002 Karafillis ............ G06F 17/5018
700/145
6,568,989 B1 * 5/2003 Molnar ................. B24B 37/013
451/41

OTHER PUBLICATIONS

Hsu et al., Boundary Lubrication and Boundary Lubricating Films, 2001, National Institute of Standards and Technology, 38 pages.*

* cited by examiner

*Primary Examiner* — Thomas C Lee
*Assistant Examiner* — Alan Chu

(57) ABSTRACT

Metal forming tool design or metal forming manufacture utilize computer aided design to generate initial tool geometry and/or to optimize or investigate possible changes in the parameters. Such computer models utilize friction parameters in combination with material characteristics of the tool and blank to assess the process before actual testing. It has been found that such models and assessment possible with such models can be significantly improved by use of a friction parameter representative of the mixed film stage of the lubricant. In a preferred embodiment an approximate average of the mixed film range is used to determine a coefficient of friction used in a computer aided design model that includes a finite element analysis procedure.

20 Claims, 14 Drawing Sheets

A sheet metal part formed from a flat blank showing: the portions of the part that contacts 1.) the die radius, and 2.) addendum.

Figure 1. Model of surface contact as a function of lubricant film thickness

PRIOR ART

Lubricant responses for a typical TCT friction curve showing the progression of COF with test duration and lubricant depletion.

© TribSys Inc 2014

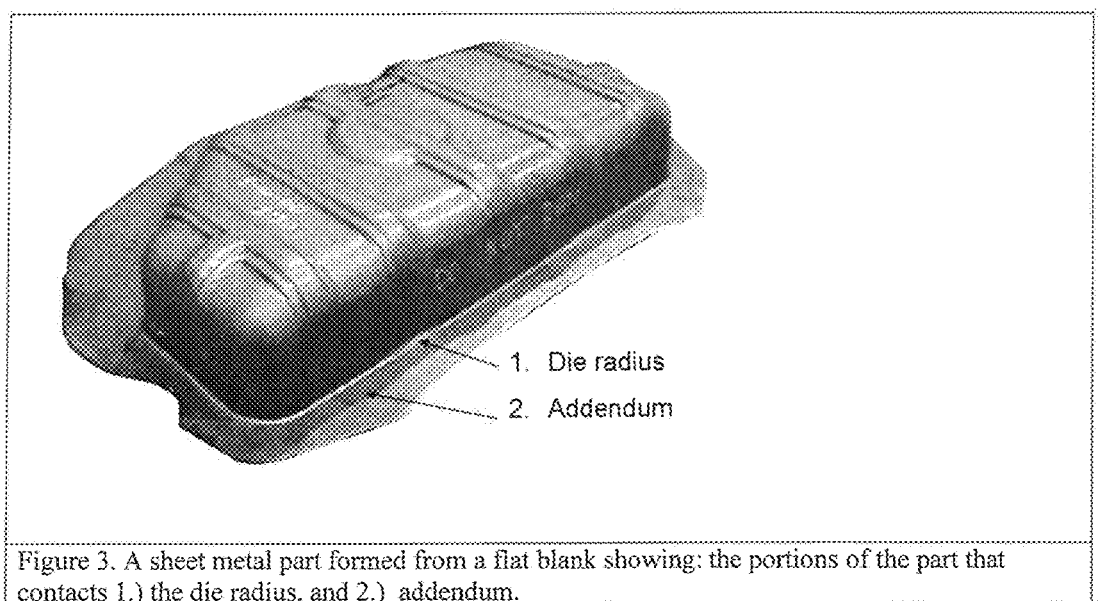
Figure 3. A sheet metal part formed from a flat blank showing: the portions of the part that contacts 1.) the die radius, and 2.) addendum.

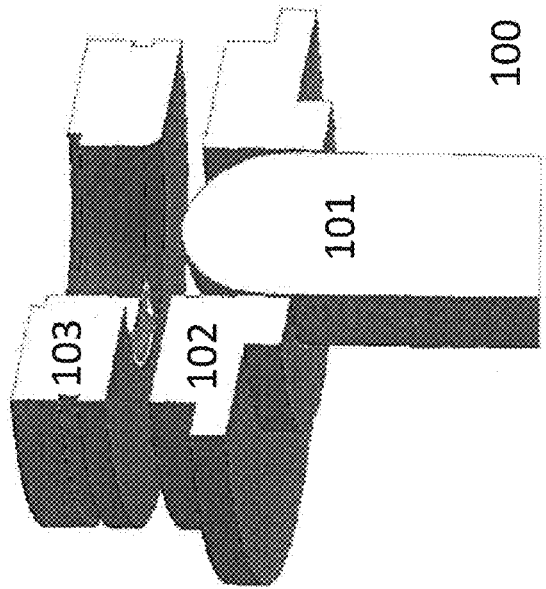
Typical Metalforming
Tooling Components:
101. Punch
102. Blank Holder (Binder)
103. Draw Ring (Die)
Figure 5. Section view of a simple metalforming tool in Figure 4.
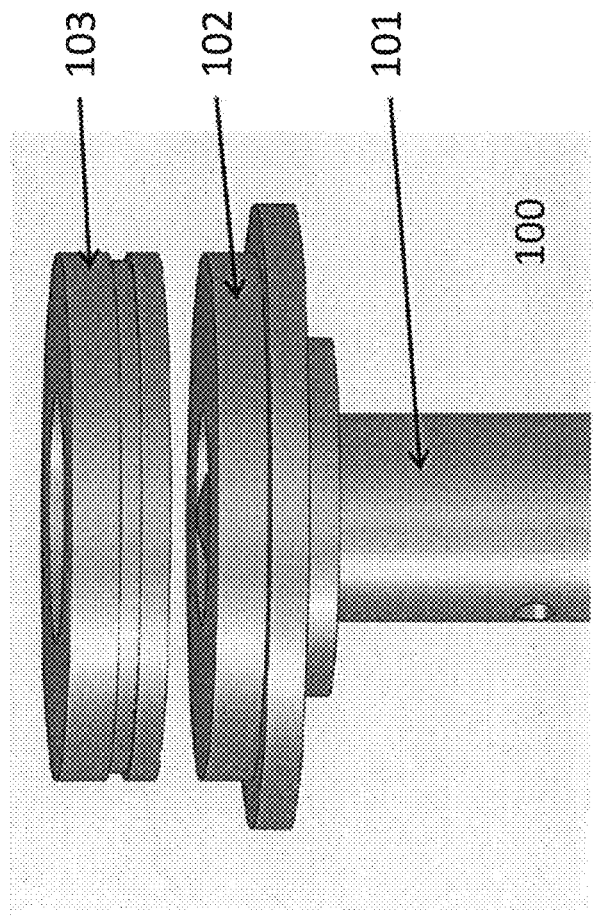
Figure 4. Schematic of a simple metalforming tool

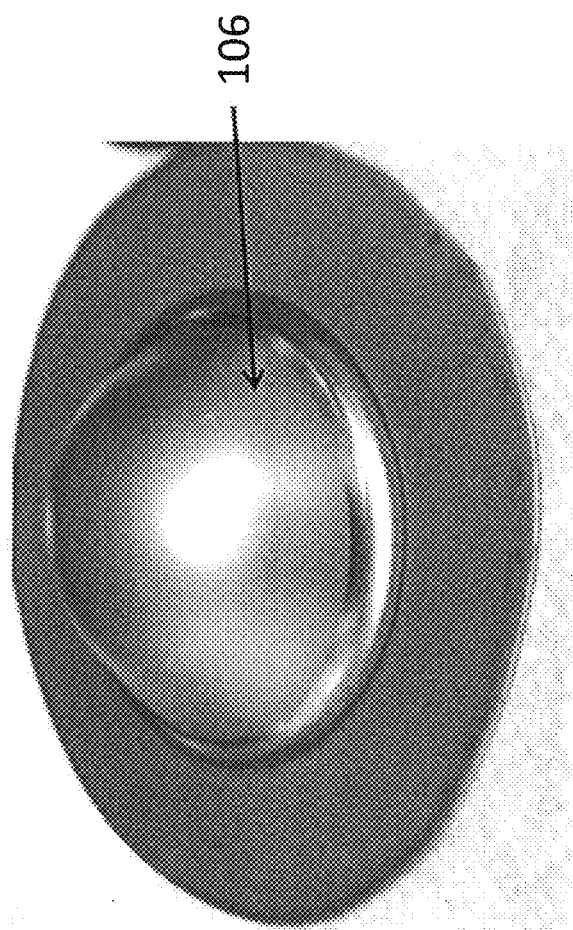
Figure 6. A drawn hemispherical cup from a flat blank formed with the tool shown in Figure 4.

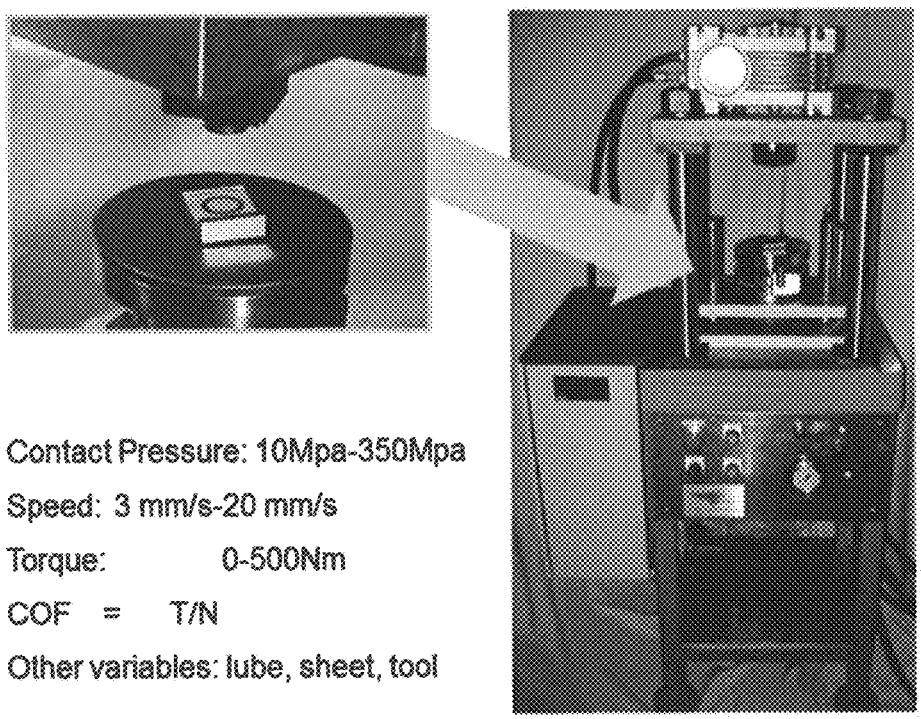
Figure 7. Twist Compression Test Apparatus with inset: Annulus and Sheet specimen in their holders

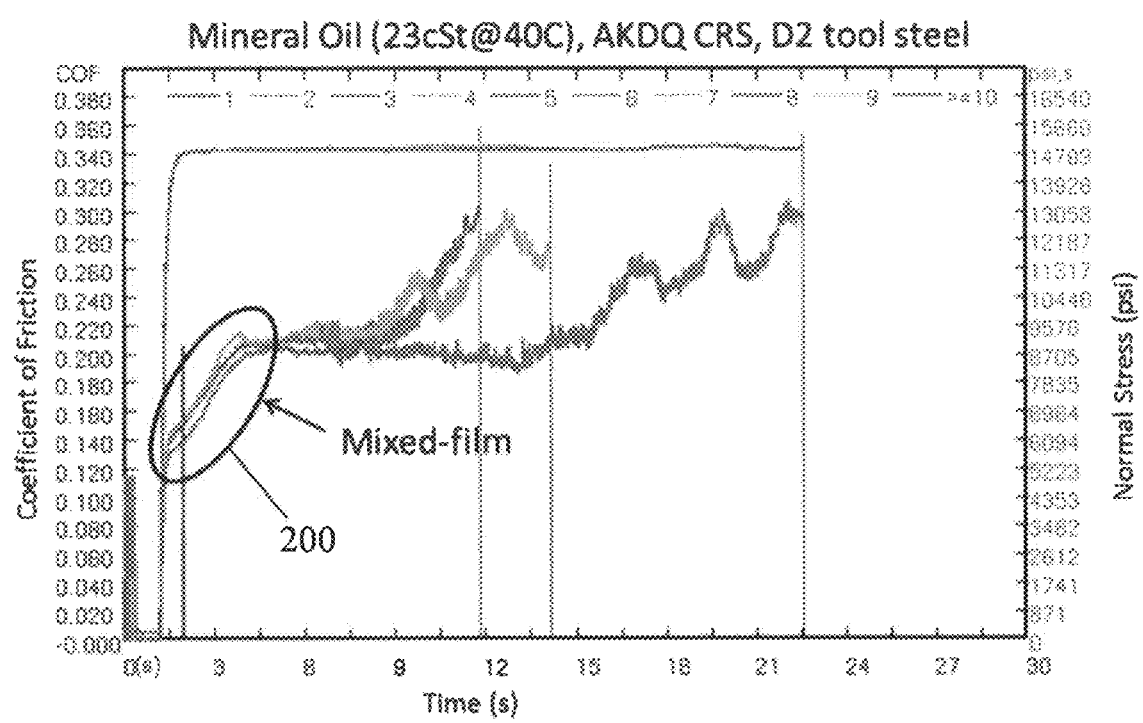
Figure 8. TCT results with an unformulated mineral oil showing three replicates and mixed-film stage circled in black.

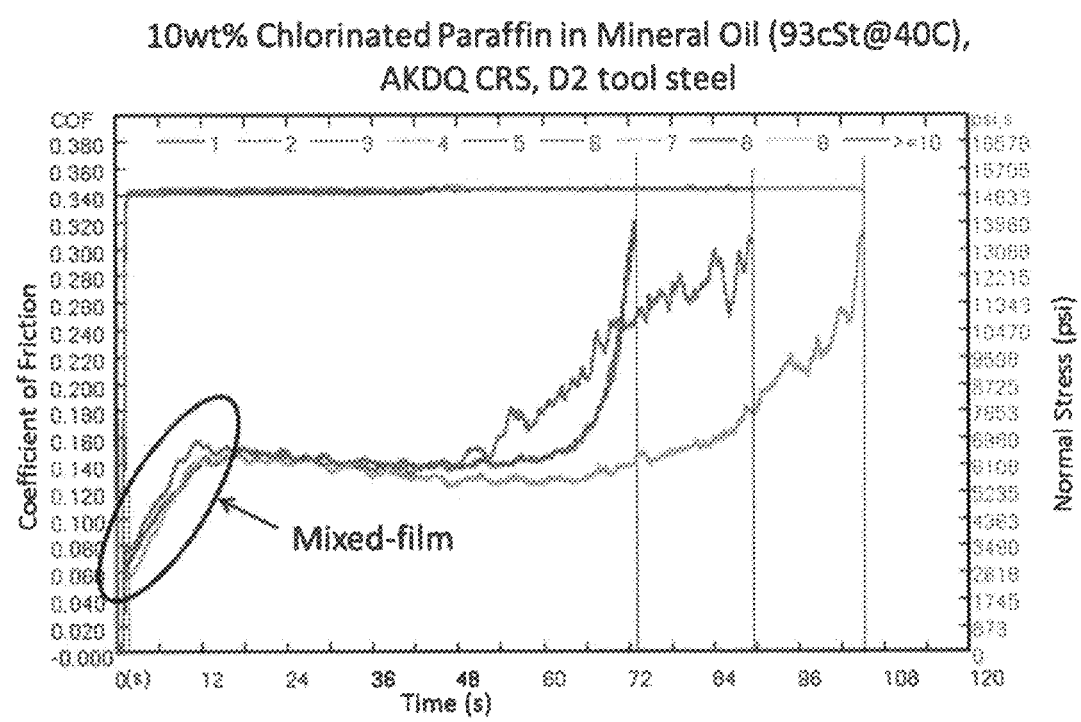
Figure 9. TCT results with a formulated mineral oil showing three replicates and mixed-film stage circled in black.

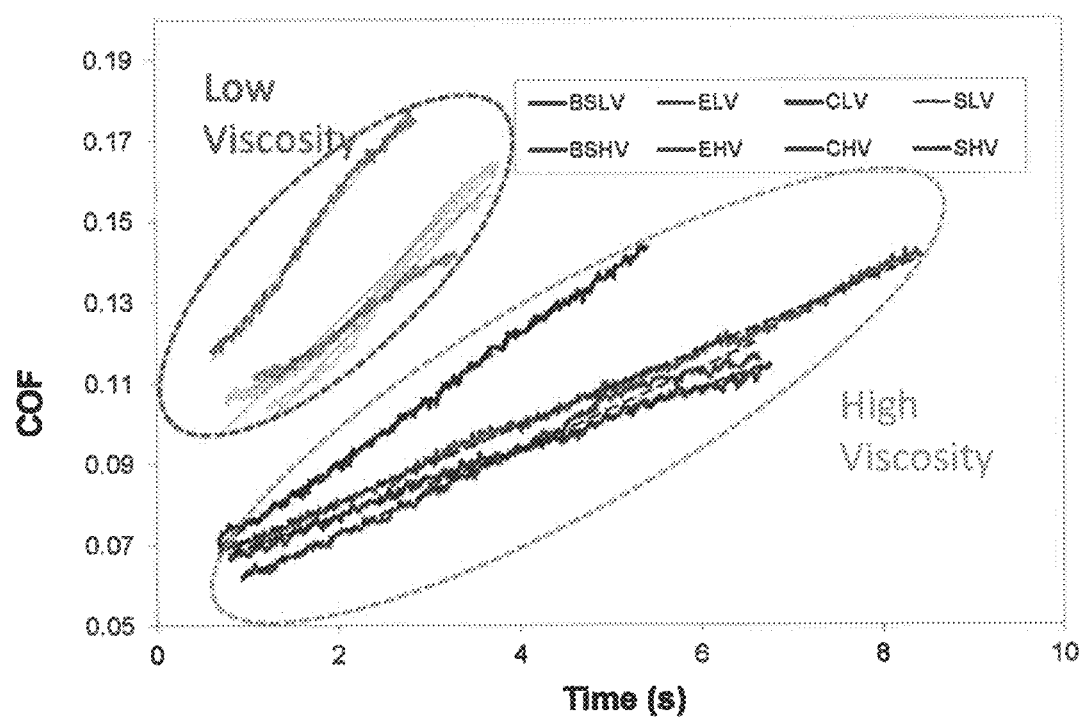
Figure 10. Mixed film portion of the TCT data curves

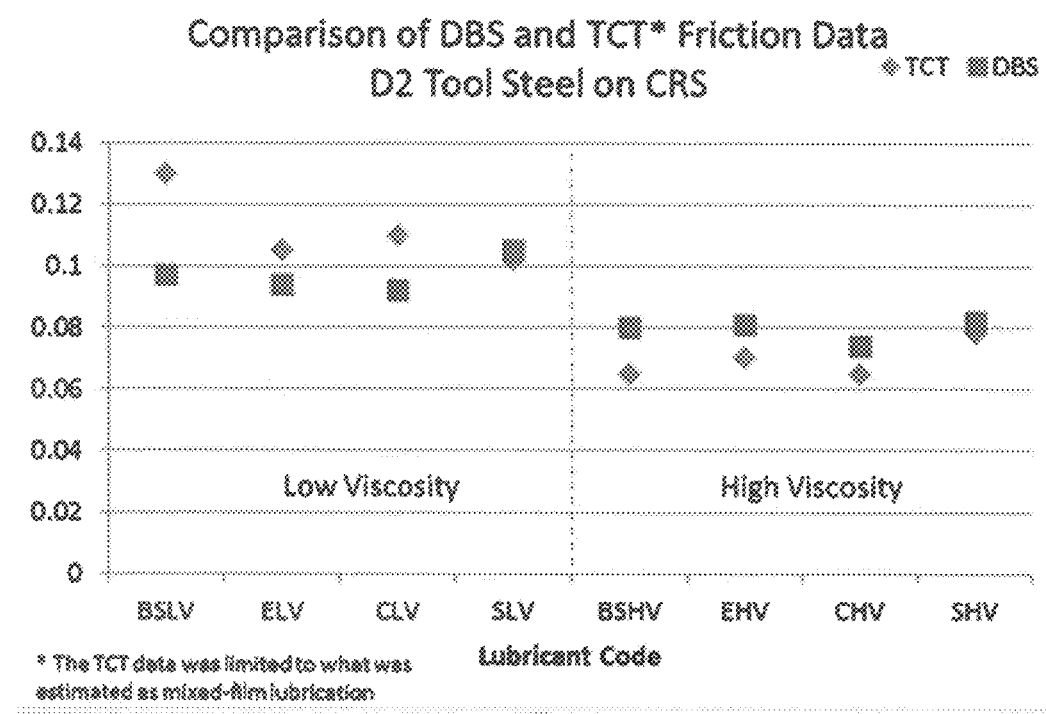
Figure 11. Comparison of DBS and TCT data (averages)

SYSTEM AND METHOD USED IN DESIGN, PRODUCTION AND OPERATION OF METAL FORMING TOOLS

This application is a continuation of PCT/CA2014/000400 filed on May 2, 2014, and claims the benefit of priority of provisional application Ser. No. 61/819,044 filed on May 3, 2013, both of which are incorporated herein by reference.

FIELD OF THE INVENTION

The invention relates to a method and system associated with initial design and manufacture of forming tools used in the production of metal parts and the operation thereof.

BACKGROUND OF THE INVENTION

The development of forming tools for producing a metal part is complex, expensive and time-consuming. Such forming tools may be used in numerous metal forming operations, such as stamping, deep drawing, stretching, tube hydroforming, sheet hydroforming, impact extrusion, warm-forming, rod and tube extrusion, heading, fineblanking, forging, tube rod and bar drawing, wire drawing, spinning, roll forming, stretch forming, tube and pipe bending, blanking and piercing, coining, swaging, press bending, ironing and flanging.

Forming tool designers typically use a computer-aided design system, usually incorporating finite-element analysis (FEA) models, to generate initial tool geometry for producing a particular metal part. Such FEA models may be used to control a computer-aided manufacturing (CAM) system to manufacture the actual forming tool. Once formed, this tool typically requires modification by a tool and die maker to perform as intended. FEA models include assessment of friction forces on the to and its addenda as it is being used to form the required shape.

In the design process, the tool designer must select and input to the FEA model a friction parameter relating to the friction force anticipated to he experienced in the tool during the forming process. Such friction parameter is a function of the coefficient of friction (COF) between the tool, the part blank (i.e. the unformed metal piece) and the selected lubricant. Generally speaking, the lubricant will be selected to be compatible with the friction specifications anticipated for the forming process and also with downstream processes such as welding and painting. Furthermore, a manufacturing facility typically has several lubricants readily available and the lubricant selected for the FEA modelling may be specified based on the intended manufacturer's preference.

Typically, a tool designer relies upon friction parameter values which have been determined. empirically from friction force data collected using a certain category of tribotests in which the lubricant is replenished during the test to maintain a fixed film thickness. These types of tribotests are herein referred to as "non-lubricant depleting" (NLD) tribotests The NLD tribotest most commonly relied upon by tool designers for sheet metal forming tools is the Drawbead Simulator (DBS). This test as used for input data for a process involves a series of steps where a lubricated metal strip is drawn through dies causing a series of bending and straightening steps that return the strip to the original orientation. The test uses the particular tool material, blank material and lubricant to determine a coefficient of friction to be used in the FEA process.

Because of the inherent properties of the lubricant in combination with a particular blank metal, tool material (including any pertinent tool coatings or surface treatment) and the geometry of the NLD tribotest, the actual thickness of the lubricant film varies from case to case and is unknown. The friction data produced by such an NLD tribotest thus represents a COF for one particular (but unknown) film thickness. In reality, however, metal forming is a dynamic process where the lubricant film thickness (and thus friction force) changes through a wide range as the lubricant is subjected to the action of compressive forces and sliding that greatly vary in different regions of the formed part.

The generalized performance of a typical lubricant as it moves through a full range of lubricant film thickness and different stages of lubricant depletion varies considerably. With reference to FIGS. 1 and 2 (showing the various stages of lubricant depletion of a typical lubricant), for relatively thick layers of lubricant, the COF is near its minimum and adjacent surfaces essentially slide past each other on a cushion of lubricant; this is the "hydrodynamic" stage of lubricant depletion. As the lubricant layer thins, perhaps allowing for increasing metal-to-metal contact, the COF starts to increase; this is a "mixed-film" stage of lubricant depletion ("MF stage"). In the case of many combinations of lubricant and tool and blank materials, the COF increases in a generally linear manner through the MF stage. As the lubricant layer continues to thin past the MF stage, the lubricant starts to break down through the "boundary", "EP activation" and final "breakdown" stages of lubricant depletion. Problems can occur in the EP activation and Breakdown stages beyond the MF stage including material buildup, cold welding and excessive wear. The "boundary" stage is sometimes included as part of the MF stage as the characteristics of the stages are closely related.

In metal forming processes, successful lubrication is critical to ensure acceptable finished part specifications, including surface quality, and to reduce maintenance of the forming tools. The geometry of an NLD test apparatus, including the DBS, is designed for the purpose of determining a COF, based on the specific lubricant and blank and tool materials, from which a friction parameter input to the FEA model can be derived. It is generally understood and assumed that the COF measured in a DBS test will be in the MF stage of the lubricant. As a result, the DBS in particular has for well over 20 years been the tribotest of choice with tool designers as the preferred means of determining friction data and COF with different process parameters in metal forming, such as blank and tool materials, tool coatings and surface treatment and lubricant.

Current FEA models do not take into account the dynamic nature of the changing lubricant film thickness, COF and resulting friction force. Instead, in current PEA models, it is necessary to select a single friction parameter value to represent the overall process. At present, the tool designer will select a friction parameter determined by an NLD tribotest (usually a DBS tribotest).

Using the accepted current assumptions, it is common that initial prototype parts produced by a forming tool will not meet the design specifications. This in turn requires trial-and-error modifications of the forming tool (potentially requiring many hours of welding and grinding) followed by more prototype production and, if necessary, further tool modification. This iterative trial-and-error tool manufacturing process involves a tool and die maker and often many months to successfully yield a tool capable of producing parts which meet the design specifications. The cost and delay can be substantial and the required time to complete the process is difficult to predict.

As a result of the above, there remains a need for an FEA-model-controlled tool design and manufacturing method and system that improves the initial tool geometry.

SUMMARY OF THE INVENTION

In the present invention a value of a friction parameter utilized in a computer modelling procedure associated with a metal forming operation is representative of the mixed film stage of the lubricant which is dependent upon the materials of the blank and the tool. Significant improvements in the accuracy of the model in generating initial tool geometry or assessing the possible impact changes to the metal forming operation are realized. Generating initial tool geometry is a particularly useful application, however other applications of the computer modelling procedure such as blank optimization are also improved. These improvements with respect to computer modelling are utilized in both apparatus and method applications. Various methods can be used to determine the value of the friction parameter to be representative of the mixed film stage.

A method of generating initial tool geometry of a tool used in a metal forming operation for producing a metal-based part from a metal-based blank according to the present invention comprises using computer aided design procedures specific to the particular metal part and the lubricant to be used in the Metal forming operation, selecting computer aided design input information including a tool material, a blank material and the lubricant having at least one assigned frictional property associated with the tool and blank material; generating an initial tool geometry for producing the particular metal part using the computer aided design input information in combination with the computer aided design procedure; and wherein the at least one assigned frictional property is derived based on evaluation of frictional properties of at least a mixed film range of the lubricant.

According to an aspect of the invention, the at least one assigned frictional property is a coefficient of friction representative of the mixed film range of the lubricant.

In an aspect of the invention, evaluation of the mixed film range of the lubricant additionally includes investigation and quantification of boundary conditions of the lubricant.

In a further aspect of the invention, the computer aided design procedure includes a finite element analysis model procedure.

According to the present invention, a computer aided design method uses a finite element analysis procedure for generating initial geometry of a tool for forming a specific part from a metal blank material in a metal forming operation that uses a lubricant. The method comprises providing finite element analysis input information including a tool material specification, a blank material specification and at least one frictional property of the lubricant associated with the tool and blank material; generating an initial tool geometry for producing the particular metal part using the finite element analysis input information in combination with the finite element analysis procedure; and wherein the at least one frictional property is based on an assessment of the mixed film regime of the lubricant.

According to an aspect of the invention, the at least one assigned frictional property is a coefficient of friction representative of the mixed film range of the lubricant.

In an aspect of the invention, the assessment of the mixed film regime also includes investigation and quantification of the at least assessment of boundary conditions of the lubricant.

In yet a further aspect of the invention, the at least one assigned frictional property is at least two frictional properties and the finite element analysis uses the at least two frictional properties to provide improved correlation between estimated performance of the tool geometry based on the finite element analysis and actual tool performance as used in the metal forming operation.

A computer aided design method according to the invention for generating initial geometry of a tool for forming a specific part from a metal blank material in a metal forming operation that uses a lubricant comprises providing design input information including a tool material specification, a blank material specification and at least one frictional property of the lubricant associated with the tool and blank material; using a computer aided design procedure programmed for the specific part in combination with the design input information to generate initial geometry of the tool; and wherein the at least one frictional property is based on a quantified assessment of the mixed film regime of the lubricant.

A system for generating a metal forming tool according to the present invention comprises a computer aided design software system operating on a computer and including a friction parameter known to be representative of at least a mixed film stage of a lubricant specified for a manufacturing process that uses the metal forming tool of a specific material to produce a product from a metal based blank of a specific material. The computer aided design software utilizes the friction parameter determined by the lubricant, the specific tool material and the specific material of the metal based blank to generate initial geometry of the metal forming tool. The automated system utilizes the initial geometry of the metal forming tool to generate the tool of the specific material.

In an aspect of the invention, the system includes test equipment for determining frictional characteristics of the lubricant with respect to the specific material of the metal forming tool and the specific material of the metal based blank where the test equipment provides detailed information of the mixed film stage and the range of the mixed film stage, and a statistical based processor that, based on the detailed information, generates the friction parameter used in the computer aided design software system.

In yet a further aspect of the invention, the computer aided design software system utilizes a finite element analysis procedure to generate the initial metal forming tool geometry.

The present invention also includes a computer system having finite element analysis software for generating initial tool geometry of a metal forming tool to be used in a metal stamping process that utilizes the metal forming tool of a specific material to stamp a metal based blank of a specific material to produce a metal based part. The finite element analysis program utilizes a friction parameter representative of a mixed film stage of the lubricant as intended to be used in the metal stamping process.

In a preferred aspect of the invention, the friction parameter utilized in the finite element analysis software is approximately an average value of the mixed film range of the lubricant.

BRIEF DESCRIPTION OF THE DRAWINGS

Preferred embodiments of the invention are shown in the drawings, wherein:

FIG. 3 is an example of a stamped metal part;

FIG. 4 is a schematic of a metal forming tool for use in a metal forming process;

FIG. 5 is a sectional view through the metal forming tool of FIG. 4;

FIG. 6 is a perspective view of a drawn hemispherical cup produced by the tool of FIGS. 4 and 5;

FIG. 7 is a photograph of a TCT apparatus;

FIGS. 8 and 9 are graphs showing 3 replicates of TCT results for two different lubricants;

FIG. 10 is a graph of the Mixed Film portion of TCT data curves for multiple lubricants;

FIG. 11 is a comparison of Drawbead Simulator (DBS) results and TCT results for different lubricants;

DETAILED DISCLOSURE

Figure 1:
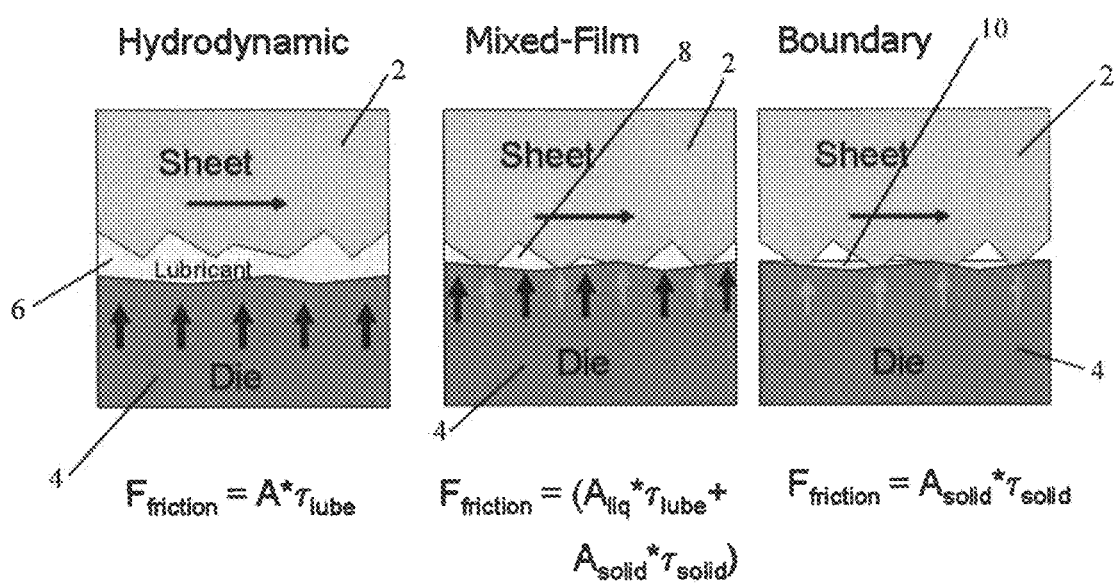
FIG. 1 is a general schematic illustrating surface contact as a function of lubricant film thickness.

As previously discussed, FEA models typically use an NLD tribotest apparatus for determining a single COF for use in the analysis. The most common NLD tribotest used for this purpose is the DBS test. Current FEA models do not take into account the dynamic nature of changing lubricant film thickness, COF and resulting friction forces. One reason for this is that accurate data showing how friction parameters change with time during the metal forming process are not readily available. Although a COF derived from a DBS test will be (or will be assumed to be) within the MF stage, a DBS test (like any NLD test) does not investigate or provide data of the MF stage (regime) and where within the MF stage the DBS-measured COF lies is not known. As a result, although a DBS-measured COF may lie within the MF stage, the present inventor has realized that a different and more reliable method of selecting a COF (or related friction parameter) has significant advantages. For example, in case the DBS measured COF is inadequate, the more reliable method would assess and select an alternative COF (or related friction parameter) from a wide range of possible alternative friction parameter values lying within the MF stage which would be better suited to the process and yield more consistent or statistically better results. In addition, even in a case where the DBS-measured COF might by sheer chance be adequate, the more reliable method arriving at the same result would provide more confidence in the result, allowing for shorter tool production design processes. In light of this realization and in contrast to the traditional approach, the present inventor has now (bund a different more reliable method of selecting a COF (or related friction parameter) which may significantly improve the design process and the initial tool geometry.

Another tribotest, the twist compression teat (TCT), exists and is normally used to evaluate lubricants, anti-adhesion additives for lubricants and anti-wear properties of lubricated surfaces for the purposes of extending tool life and reducing surface quality issues of finished parts. For example, once tooling has been produced and is being tested or gone into production, the performance of the tooling and anticipated life expectancy is tracked. The actual performance and life expectancy of the tooling may be less than desired. Such deficiencies can sometimes be caused by the initial choice of lubricant for the process which may, for example, have a much higher than anticipated COF at some point in the specific metal-forming process where the lubricant may to unexpectedly or undesirably be operating in its EP activation stage, or even in its final breakdown stage, causing problems such as cold welding between contacting surfaces. These types of deficiencies: can sometimes be remedied or improved by changing the lubricant or its additives or by adjusting operating parameters, with the effect of avoiding or at least delaying the entry of the lubricant into undesirable portions of its EP activation or final breakdown stages. The TCT is used to test possible lubricant improvements with a view to enhancing performance near or in the EP activation or final breakdown stages of the lubricant when used with a particular tool in a particular metal-forming operation.

To evaluate performance in the EP activation and final breakdown stages of the lubricant, the TCT apparatus moves from an initial rest position to a maximum engaged position. In effecting this movement, the lubricant moves through the initial stages of lubricant depletion to arrive at the stages of interest—namely the EP activation and final breakdown stages—where breakdown of the lubricant occurs, affecting the performance or life expectancy of the tooling. Thus, although the TCT also passes through the hydrodynamic, mixed film and boundary stages to reach the EP activation and final breakdown stages of interest, data relating to the initial stages (including the MF stage) is either not collected, not reported or is ignored because it is not germane to the objectives of the TCT—namely to collect data in the EP activation and final breakdown stages.

A significant improvement in the initial geometry of the tooling can be realized by adopting a friction parameter or coefficient of friction for the FEA process that is based on the particular lubricant and the tool and blank materials and knowledge of the mixed film stage of the lubricant.

Evaluation of the mixed film stage and selection of the coefficient based on this analysis provides better initial geometry of the tooling and results in tooling that requires less modification before being placed into production. Selection is based on knowledge of the mixed film stage of the lubricant to provide a COF that is more likely to allow the tooling to function in the desired manner.

FIG. 1 is a simplification of different initial stages of a lubricant as the process becomes more demanding and breakdown starts to occur. In the initial hydrodynamic regime (or stage) there is always a lubricant layer between the blank 2 and the die 4. The lubricant layer is shown as 6. The next stage of the lubricant breakdown is the mixed film stage. The pockets 8 are filled with lubricant separating the blank 2 and the die 4 but there is some contact of the blank with the die between the pockets. A very thin, molecular-scale, layer of lubricant is fed from the lubricant pockets into these points of contact providing protection from direct contact between the blank and the die. FIG. 1 also illustrates the boundary stage where the lubricant 10 no longer fills the various pockets and thus the replenishment of the lubricant into the points of contact is lost and with continued sliding direct contact is inevitable.

Figure 2:
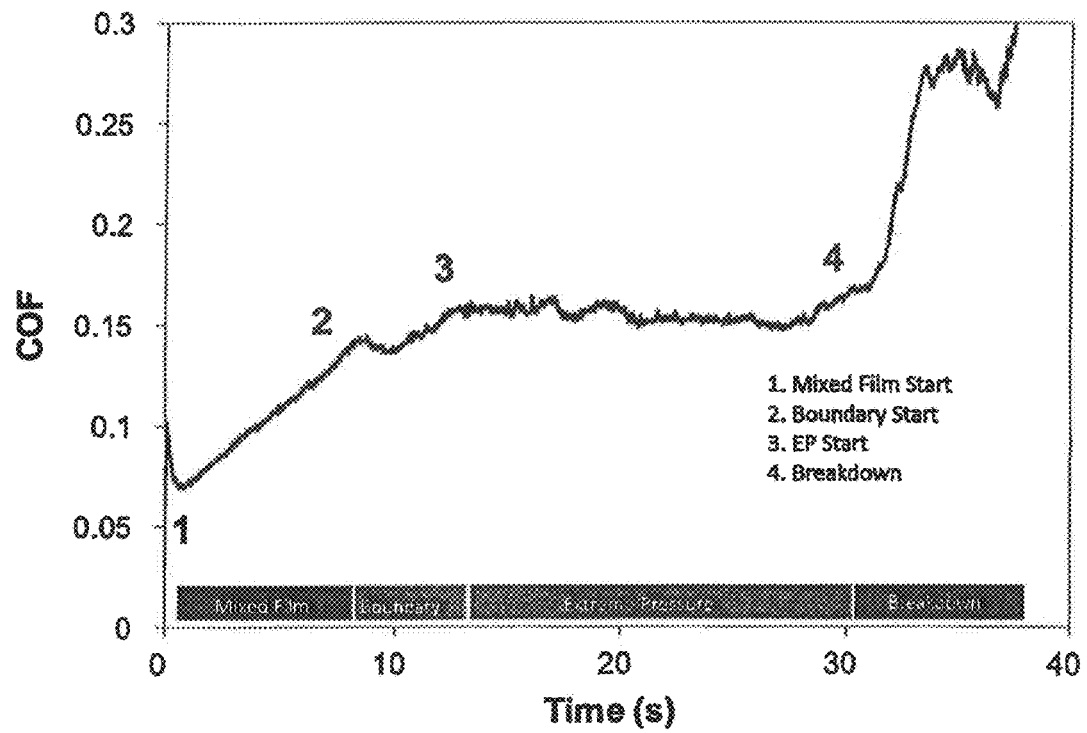
FIG. 2 is a graph of a lubricant response for a typical Twist Compression Test (TCT) friction curve and the identified changes of a Coefficient of Friction with lubricant depletion.

There are a number of different tribotests associated with lubricants and known frictional properties of the lubricant in each of the stages of hydrodyriamic, mixed film, boundary, EP activation and breakdown as shown in FIG. 2. FIG. 2 is a representative graph typical of a twist compression test curve with different stages of the lubricant identified. The inventors found that the mixed film stage, and in some cases the mixed film stage in combination with the boundary stage, provides improved information for selecting a frictional parameter, such as the coefficient of friction, that is used in computer aided software design with respect to tool design, and in particular is useful for finite element analysis programs and techniques associated with tool design. By using the appropriate frictional parameter taking into account the mixed film stage and/or the mixed stage and boundary condition stage, the initial tool design is improved and typically the amount of testing and modification of the tool in the initial testing of the tool can be reduced. This is a very significant advantage in that the modification of tools that have been manufactured in accordance with initial tool geometry from a finite element analysis program typically requires less modification and testing by a tool and die maker. This can allow the tool to be placed into production more quickly and it also reduces planned lead time necessary to assure tooling will function in the intended manner.

The mixed film stage of most lubricants is generally linear and has an initial lower coefficient of friction that progressively increases and terminates at a higher coefficient of friction. The slope of this generally linear stage can vary substantially. In the boundary stage there is often a slight drop in the coefficient of friction followed by a continued increase in the coefficient. A person skilled in the art can readily identify these various stages based on the results from a twist compression test, for example.

Although the twist compression test is well known, as noted above, it is typically used to consider modifications or replacement of the lubricant to address specific production problems. This is obviously well after the initial tool design and well after the modification of the tool to allow it to be effective for production. For example, during production it may be found that the tool is being damaged or material is being transferred from the blank to the tool. This is typically associated with cold welding and represents the lubricant not operating in the desired stage. The production engineers or the lubricant specialist will then consider modifying a lubricant to provide the required lubrication to overcome the specific problem. Thus the twist compression test values for lubricants have not been previously considered to provide an assessment or to select a frictional parameter associated with the mixed film and/or the mixed film and boundary condition of a lubricant.

FIG. 3 shows a metal part formed from a blank where the part includes the die radius 1 and the addendum 2. During the manufacture of this part the actual lubricant will be in different stages due to the different geometry of the part and the manufacturing process, in the initial design of tooling the programming to date, although very complex, typically uses a single coefficient of friction. The tool is designed for a particular lubricant based on the complexity of the part and prior knowledge. Most manufacturing plants restrict the number of lubricants that can be used in order to simplify the process. Therefore the designer of tooling made-for a particular manufacturer will already know the preferred lubricant and the present invention utilizes the frictional characteristics of this lubricant in the mixed film stage and/or in combination with the boundary stage. In some cases, a mere averaging of the coefficient of friction within the mixed film stage provides good results, in other cases, a person skilled in the art may wish to modify the coefficient of friction to be closer to one of the two end points. In other cases it may be appropriate to also consider a coefficient within the boundary stage and the selection can take this into account. It is anticipated that the modeling software, including finite element analysis software, will include in the future the ability to use multiple or different coefficients of friction for different parts of the process, as a function of time and/or of location within the part, to further improve the accuracy of the initial tooling geometry. Such frictional coefficients will still be dependent upon the parameters within the mixed film and boundary stages.

FIGS. 4 and 5 show a simple metal forming tool 100 comprising a punch 101, a blank holder 102 and a die or draw ring 103. This metal forming tool is used to produce the hemispherical cup 106 shown in FIG. 6. The hemispherical cup is produced from a fiat circular blank inserted in the metal forming tool and held between the blank holder and the draw ring.

In this application the tool used to produce a metal based part may not produce a finished part. For example a finished part may be produced by a series of stamping operations and then the stamped part may be combined with other parts and/or involved in further finishing steps. The term metal-based blank also includes metal-based preformed blanks.

Computer-aided design procedures including finite element analysis procedures assist in the development of stamping tools, the improvements in use of the stamping tools and/or assessing possible changes associated with the stamping tools or the produced parts, or changes in the parameters including the lubricant. The use of the friction parameter of the lubricant according to the present invention is useful in all of these applications.

A typical twist compression test apparatus is shown in FIG. 7. This test will use both the specified tool material and the specified blank material in combination with the particular lubricant to provide the frictional parameters associated with the mixed film stage and boundary stage, typically in combination with the remaining stages for review and selection by the operator. In this way, input information to the computer aided design will include both the material specification, the blank material specification and the lubricant frictional parameters such as the coefficient of friction selected as discussed above.

It should be noted that the term lubricant can be a mixture of lubricants, one or more lubricants and a blank wash or a soap and/or one or more lubricants and conversion coatings. The lubricant has known properties and in particular known friction parameters that can be assessed with respect to the mixed film stage and utilized in any of the procedures described herein.

In FIG. 8 the various coefficients of friction for a particular mineral oil as determined by the twist compression test are shown with three separate tracks. It can be seen that the mixed film stage 200 is quite consistent for the three different tracks. Selecting the frictional parameter from the mixed film stage for input into computer aided design software improves the initial geometry of the tool. FIG. 6 shows a similar test result for a 10% by weight of chlorinated paraffin in a particular mineral oil in association with two different materials. Again the mixed film stage 200 is fairly consistent.

FIG. 10 shows various mixed film stage data for different lubricants and the mixed film stage is generally linear.

In FIG. 11, a comparison is shown of the draw bead simulator and the mixed film evaluation of the present invention. For low viscosity lubricants with respect to these particular test materials, it can be seen that the draw bead simulation values of the coefficient are lower than the twist compression test data coefficients that were based on an average. With respect to high viscosity lubricants, on the second part of the graph it can be seen that the twist compression test data is lower than the previously used draw bead simulation data.

In the actual manufacture of a metal forming part, the lubricant will not operate in a range representative of the draw bead simulation frictional value. This is essentially a perfect or highly desirable lubrication stage and is not representative of the manufacturing process. By providing a more realistic estimate of the coefficient of friction that will be encountered in the manufacturing process, the finite element analysis and/or other software for initial tool design provides superior initial tool geometry. In contrast, merely guessing at an appropriate coefficient of friction or using values based on a draw bead simulation will likely require considerable modification of the initial tool geometry.

Figure 12:
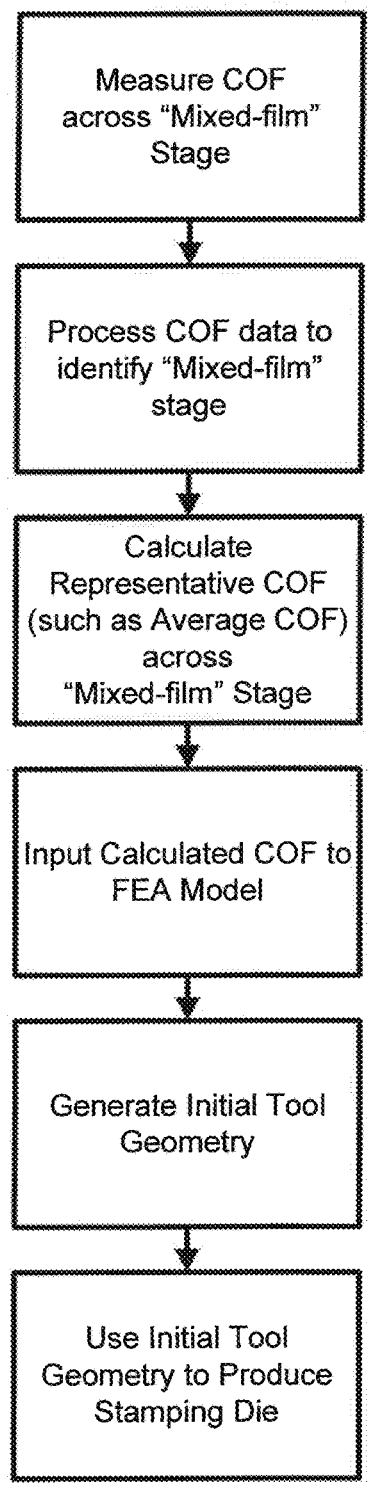
FIG. 12 is a schematic flow chart of steps used in the present process for producing an initial production tool.

FIG. 12 illustrates a particular flow chart of the logic used in association with the initial design and manufacture of a stamping die. FIG. 10 shows yet a further modification of such a process to produce a stamping die. FIG. 11 shows the initial design of the finite element analysis being used to produce initial tooling and FIG. 12 shows a design process where the lubricant has been previously tested or a series of lubricants have been previously tested with different materials such that the frictional parameters thereof associated with the mixed film stage and/or the mixed film stage and boundary stage are known and available for use in the initial tool design.

In accordance with the invention, the inventor has recognized that a tribotest capable of measuring lubricant performance through the full MF stage [herein referred to as a "full MF depletion" or "FMFD" tribotest], such as for example the TCT tribotest, may advantageously be used in FEA-model-controlled processes and systems for manufacturing forming tools for production of metal parts.

Referring to FIG. 12, a process for producing a forming tool of a particular tool metal to produce parts of a particular blank metal using a particular lubricant is shown in which the following steps occur:
  one or more tribotests are performed on the desired combination of tool material, blank metal and lubricant, so as to measure a friction parameter, such as the COF, across at least about the full MF portion of the friction curve ("MF curve") for the lubricant. Preferably, a FMFD tribotest is performed several times for such purpose. A friction parameter, such as the COF, is measured across at least about the full MF portion of the friction curve ("MF curve") for the lubricant. In a preferred embodiment, the FMFD tribotest is performed by a TCT apparatus and the measured friction parameter is the COF, but any other friction parameter or FMFD tribotest could be used:
  the friction parameter data is processed to identify and extract the MF curve, preferably the full MF curve;
  the processed friction parameter data is used to calculate a single representative friction parameter value representing the full MF curve. Although, in a preferred embodiment, the representative COF value will be an average of the COF values at the start and end points of the full MF curve, other forms of statistical calculation (involving all or a portion of the MF curve) deemed more appropriate for the particular application could be used;
  the calculated representative friction parameter value is input to the FEA model; and,
  the FEA-model-controlled system produces the forming tool.

In an alternate embodiment, the measuring step may occur in advance of the tool manufacturing process for combinations of blank materials, tool materials and lubricants deemed to be "standard" or likely to be used on a frequent basis. The measured friction parameter data for each such "standard" combination may be stored in a memory and retrieved as required and subsequently processed as above.

With knowledge of the MF stage and/or the MF stage and boundary, the behavior of the lubricant in the manufacturing process is estimated with improved accuracy as the representative value is known relative to its position in the MF stage as well as how rapidly it may change as it shifts from this value clue to the actual process or particular portions of the process. Use of an FEA model procedure for initial tool geometry or assessing the impact of modified components within an FEA model are improved by selecting of the friction parameters as outlined above.

Using an average value of the MF stage is one approach but other statistical treatments can he used including the data range. For example it may be appropriate to discount some of the initial or end values or to use a desired weighted average. Knowledge of the MF stage and the process can be helpful in the selecting the representative value, however the average works well in most applications.

Knowledge of the MF stage is also of assistance in considering possible changes to tooling or the use thereof such as adding a coating layer to a blank (such as a phosphate coating), adding a polyethylene layer, or providing a surface coating on a tool (such as chromium). These and other possible changes can be modelled using the new friction parameter data and assessed for improvements in performance in advance of actual testing. Another application may be investigating alternative lubricants, such as a lower cost lubricant or a specialty lubricant.

Figure 13:
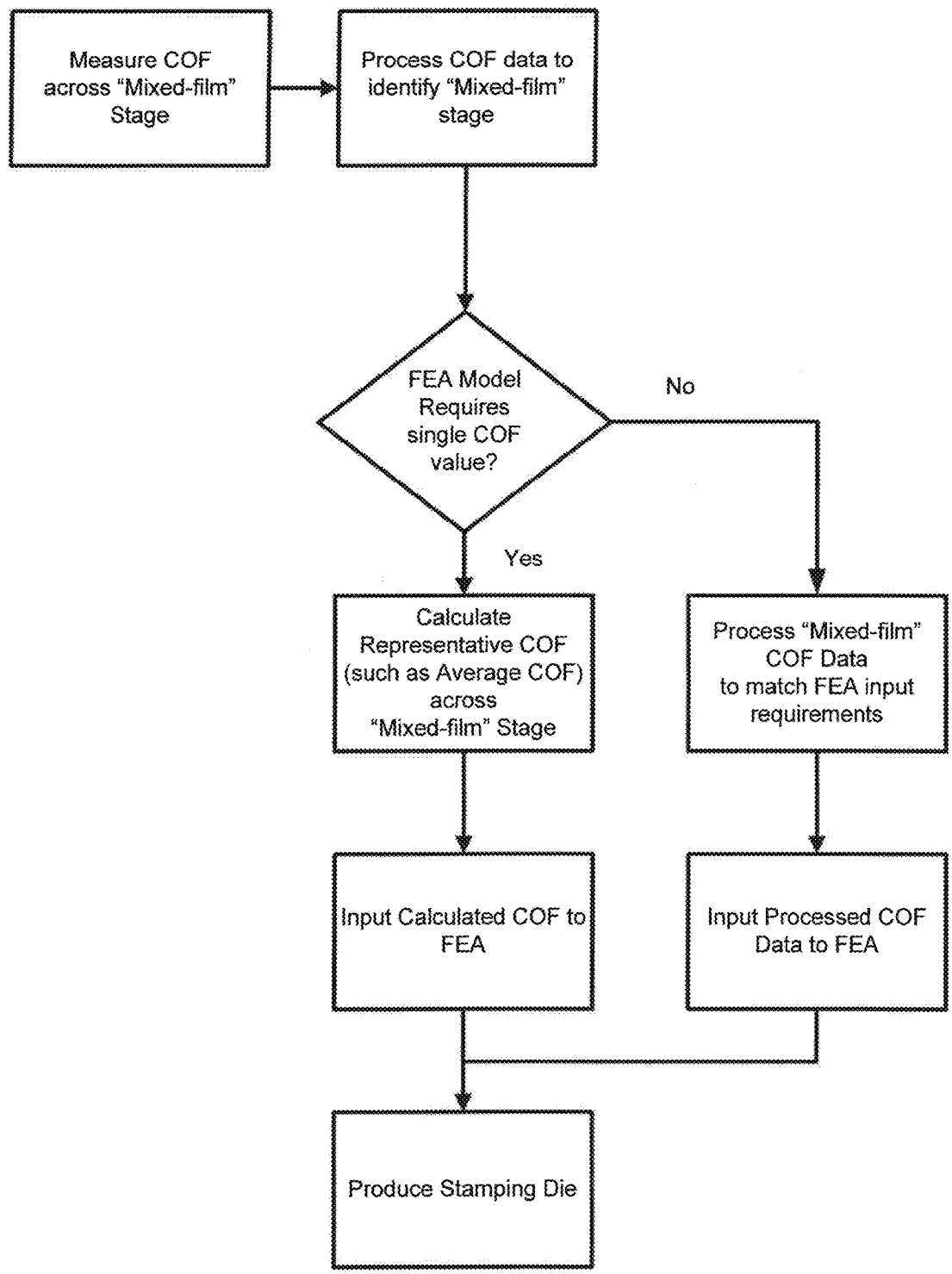
FIG. 13 is a flow of an alternate process where additional frictional parameters can be provided to a finite element analysis model and produce an initial tool.

Referring to FIG. 13, another process for producing a forming tool of a particular tool metal to produce parts of a particular blank metal using a particular lubricant is shown in which the following steps occur:
  one or more tribotests are performed on the desired combination of tool material, blank metal and lubricant, so as to measure a friction parameter, such as the COF, across at least about the full MF portion of the friction curve ("MF curve") for the lubricant. A FMFD tribotest is performed several times for such purpose. A friction parameter, such as the COF, is measured across at least about the full MF portion of the friction curve ("MF curve") for the lubricant. In a preferred embodiment, the FMFD tribotest is performed by a TCT apparatus and the measured friction parameter is the COF, but any other friction parameter or FWD tribotest could be used;
  the friction parameter data is processed to identify, and extract the MF curve, preferably the full MF curve;
  a test is performed to determine the nature of the FEA-model;
  if the FEA-model requires the input only of a single representative friction parameter value, the steps described above are performed;

if the FEA-model requires input of friction parameter data in a different format, the friction parameter data is processed to match the requirements of the FEA-model and the processed friction parameter data input to the FEA-model; and, the FEA-model-controlled system produces the forming tool.

In an alternate embodiment of the above process, the measuring step may occur in advance of the tool manufacturing process for combinations of blank materials, tool materials and lubricants deemed to be "standard" or likely to be used on a frequent basis. The measured friction data for each such "standard" combination may be stored in memory and retrieved as required and subsequently processed as above.

Figure 14:
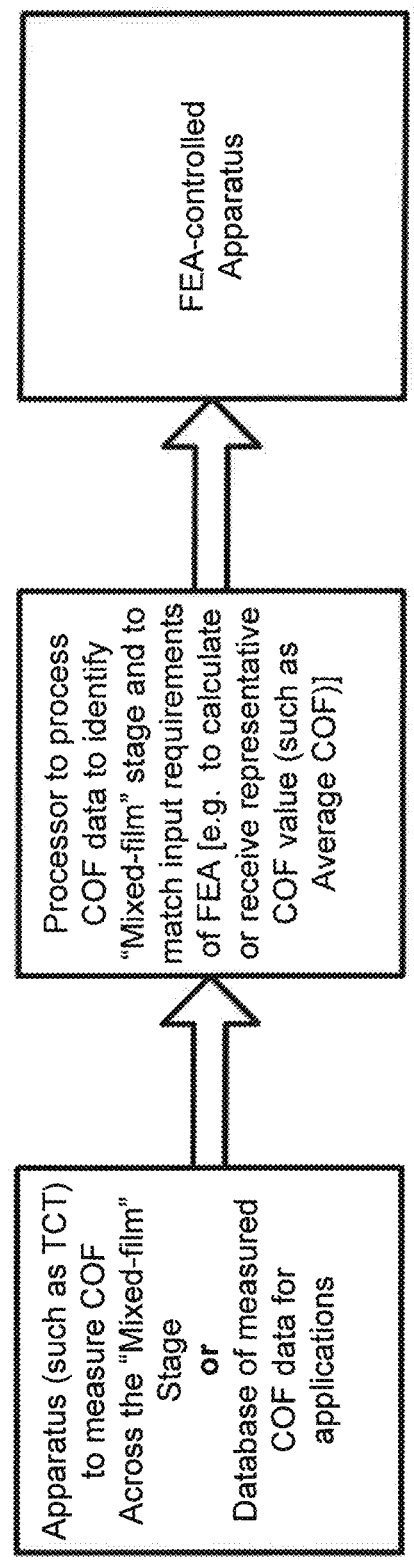
FIG. 14 is a schematic showing the use of the COF as determined by the present invention and the use thereof in an FEA model.

Referring to FIG. 14, a system for producing a forming tool of a particular tool metal to produce parts of a particular blank metal using a particular lubricant is shown which includes the following components:

a tribotest apparatus capable of measuring one or more friction parameters, such as COF, across at least about the full range of the MF stage for desired combination of tool material, blank metal and lubricant is provided. Preferably, the tribotest apparatus is an FMFD tribotest apparatus. In a preferred embodiment, the FMFD tribotest apparatus is a TCT apparatus to measure COF values, but any other FMFD tribotest could be used or friction parameter measured;

a processor operably linked to the FMFD tribotest apparatus to receive measured friction parameter data from the FMFD tribotest apparatus. The processor processes the friction parameter data to identify and extract the "mixed-film" portion of the friction curve and to match the input requirements of a downstream FEA-model-controlled tool manufacturing apparatus. In this latter respect, the processor may for example calculate a single representative friction parameter value for use in an FEA-model requiring the input of a single friction parameter value. Although, in a preferred embodiment, a representative COF value will be an average of the COF values at the start and end points of the full MF curve, other forms of statistical processing (involving all or a portion of the MF curve) deemed more appropriate for the particular application could be used. The processor may comprise a general purpose computer programmed in a suitable manner or a dedicated processor; and, an FEA-model-controlled manufacturing apparatus operably linked to the processor to receive processed friction parameter data from the processor and to manufacture the tool.

In an alternate embodiment of the above system, a memory may be provided in which to store data generated by the tribotest apparatus for combinations of blank materials, tool materials and lubricants deemed to be "standard" or likely to be used on a frequent basis. In such case, the processor will be capable of controlling the storage and retrieval of the measured friction data in/from such memory for each such "standard" combination as required.

Friction data across at least about the full range of the MF stage measured by one or more tribotests can be usefully applied, as described above, in selecting an appropriate friction parameter value for input to an FEA-model. It is noted that in particular FMFD tribotest-derived friction data is generated from contact with a diminishing, non-replenishing film thickness and such a test process corresponds well with the actual forming process. Accordingly, it is believed that a representative friction parameter calculated in accordance with the above, being based on measured friction parameter values throughout the full MF stage, will in general more reliably and consistently reflect the overall dynamic forming process, as compared to the conventional approach using a friction parameter from a conventional NLD tribotest, thus leading to improved performance of the FEIN model.

In addition, unlike the DBS and many other tribotests, the TCT can be used with a wide variety of lubricants, materials and material thicknesses.

Moreover, in future, it is expected that FEA models will evolve to incorporate dynamic considerations, such as a friction parameter which is a linear or other function of time, or film thickness, or a friction parameter which is actually measured or sampled across the full range of time or film thicknesses including boundary and EP stages. The methods and systems of the invention will be available to support such future FEA-model enhancements by having the ability to deliver accurate dynamic friction parameter data (for example as measured in an FMFD tribotest) to be processed into suitable dynamic inputs to the FEA-model.

Data from different segments of a tribotest-measured friction curve may be extracted to compare lubricant performance at various times in the progression of the test to lubricant failure. Furthermore a friction curve, particularly one derived from an FMFD tribotest, rather than a single friction parameter value may improve the ability to predict part geometry from the metal forming process because it may better reflect the dynamic nature of the metal forming process.

In addition, the availability of measured friction parameter data as the contact conditions move through the full range of the lubrication stages may allow for the better design and/or selection of lubricants for the particular forming process. For example, part geometry could in some cases be improved (e.g. to produce sharper details) by increasing the force transmitted to the blank at the end of the forming cycle. In such a case, a lubricant having a steep positive slope in the MF curve will be much more sensitive than a lubricant with a shallow slope. A sensitive lubricant with a steep COF slope would be selected to produce a much lower COF at the start of the forming cycle and, as that point on the blank moves across the addendum towards the tool radius (see FIG. 3), rapidly increasing COF values as the process moves toward its end, with the effect of generating rapidly increasing stress in the formed part and of producing the desired strain pattern result.

As another example, a less sensitive lubricant could be desirable in other situations. For example, a lubricant with a COF that displays a shallower slope could be used for parts that display a tendency to split at the end of the forming cycle. A slowly changing COF with a lower COF at the end of the cycle could prevent splitting by reducing the stress.

As another example, lubricant formulators can use the friction parameter data from the MF curve to identify optimal lubricant additive levels by varying the additive content and seeing when more additive no longer produces the desired effect.

Application of the friction parameter data to an FEA model or to the selection process for metal forming lubricants could be further refined by selecting a more conservative (lower film thickness) portion of the curve to match the severity of the forming process.

The ease of obtaining FMFD tribotest-derived friction data means that more parameters in the metal forming process can be explored and that lubricant development time can be shortened with the FMFD versus other tribotests. In particular knowledge of the range of the MF stage and the slope of the MF stage provides assistance in selecting a lubricant and/or assessing whether a particular lubricant is appropriate.

Figure 15:
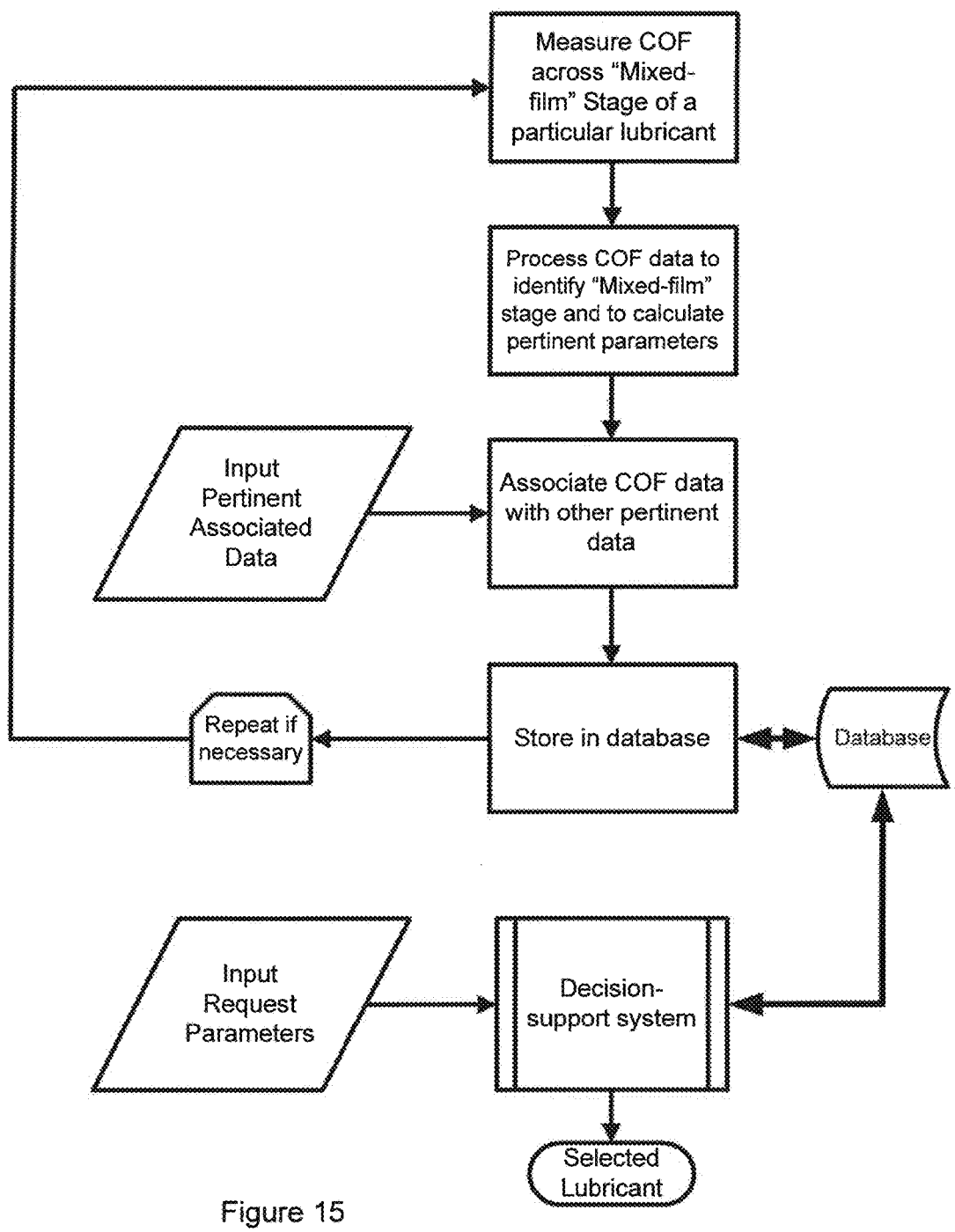
FIG. 15 is a system arrangement that includes a database of friction parameters determined in accordance with the present invention and the selecting of an appropriate lubricant.

The analysis of the process requirements and the selection an appropriate lubricant formulation for a particular forming process may be accomplished using a decision-support system accessing a knowledge base of relevant data. For example, as shown in FIG. 15, measurements of the COF of a particular lubricant used in association with particular blank and tool materials across the full MF stage may be made in the manner described above, such as by using a TCT or other FMFD tribotest apparatus. Also as described above, the friction data is processed to identify the full "mixed-film" portion of the friction curve. As set out above, the friction data may be thither processed to calculate a single representative COF value representing the full MF curve. In addition, however, additional processing of the tribotest data may occur to identify other pertinent parameters. For example, the slope of the friction data across the full MF curve or other lubrication stages may be calculated. The data as processed may be associated with the measured data in a data record. Additionally, other pertinent information associated with the particular test (such as blank material, blank metal thickness, blank surface coating(s), tool material and surface treatment, assessment information relating to parts produced, compatibility with downstream processes such as welding and painting) may be associated with the data record as well. The data record is then stored in a database. The process may be repeated as necessary to cover all desired combinations of lubricant, materials and other pertinent parameters. In this manner, a database of relevant friction data is created. Subsequently, a suitable decision-support system may access the database in response to appropriate input of request parameters (such as blank metal, blank metal thickness, tool material, problems to he avoided) to arrive at the identification of a specific lubricant for a particular purpose.

The improved selection of a COF or other friction parameter for use in a FEA model procedure has been primarily described with respect to improvements associated with initial tool geometry. This is perhaps the most common use of the FEA model procedure but there are other variations of the FEA model that can advantageously use the improved COF selection. For example the FEA model for a known tool geometry can be used to predict the part shape if a different blank material and/or lubricant were desired in order to optimize production. The predicted part shape could then be compared to the original part shape to determine whether it is within a specified tolerance.

The computer-aided model, preferably a FEA model can also be used in the known manner with respect to blank shape optimization and the initial determination of a developed blank. Other known investigations can be improved by using the friction parameter (coefficient of friction) representative of the MF stage lubricant characteristics. All of these improvements and variations are included in the present invention.

The detailed description has described the use of databases and the use of computer aided design software and other computer systems appropriately modified to utilize or access friction parameters associated with the mixed film stage of lubricants for specific metal forming procedures. These computer programs and databases in computer executable form are stored on a storage means (such as hard drive, USB key, DC, DVD or other storage device) for access and use in the intended manner.

Although various preferred embodiments of the present invention have been described herein in detail, it will be appreciated by those skilled in the art that variations may be made thereto without departing from the claimed invention.

The embodiments of the invention in which an exclusive property or privilege is claimed are defined as follows:

1. In a computer-aided design model procedure specific to the production of a metal-based part from a metal-based blank in an intended metal forming operation that uses a lubricant and metal-based tooling of a geometry for producing the metal-based part,
   the improvement comprising
   determining changing values of a friction parameter through the mixed film stage of the lubricant as used with the metal-based blank and the metal-based tooling;
   based on said changing values of said friction parameter selecting a value of said friction parameter representative of the mixed film stage of the lubricant;
   using said selected friction parameter value in said computer aided design procedure and producing initial metal-based tooling geometry specifications or specifications for initial geometry of the metal-based blank for a known geometry of said metal-based tooling.

2. In a computer-aided design model procedure as claimed in claim 1 including using the computer-aided design procedure to produce initial metal-based tooling geometry specifications for manufacture of the metal-based part.

3. In a computer-aided design model procedure as claimed in claim 1 wherein the computer-aided design procedure is used to produce initial geometry of the metal-based blank.

4. In a computer-aided design model procedure as claimed in claim 1 wherein the computer-aided design procedure is used with known generated initial tool geometry and said computer-aided design procedure is used to investigate a change in blank material and an associated change in the selected friction parameter values and assess whether the metal-based part of the new blank material intended to be produced by the metal forming operation will be within an accepted tolerance.

5. In a computer-aided design procedure as claimed in claim 1 wherein said selected friction parameter value is a coefficient of friction (COF) representative of said mixed film stage that includes a boundary stage of the lubricant as used in the computer-aided design procedure.

6. In a computer-aided design procedure as claimed in claim 1 wherein said computer-aided design procedure is a finite element analysis model procedure.

7. A method of generating initial tool geometry of tooling used in a metal forming operation for producing a metal-based part from a metal-based blank,
   said method comprising using a computer aided design procedure specific to the particular metal part and a lubricant to be used in the metal forming operation,
   determining changing values of a friction parameter through the mixed film stage of the lubricant as used with the blank material and the tooling material and selecting a value of the friction parameter representative of the lubricant through the mixed film stage;
   selecting computer aided design input information including a tooling material, a blank material and the selected value of the friction parameter of the lubricant; and
   using said computer aided design input information in combination with said computer aided design procedure to produce initial tooling geometry specifications.

8. A method as claimed in claim 7 wherein said computer aided design procedure is a finite element analysis design procedure.

9. A method as claimed in claim 7 wherein said friction parameter is a coefficient of friction representative of the mixed film stage of the lubricant.

10. A method as claimed in claim 7 wherein said step of determining changes of the friction parameter in the mixed film stage includes, as part of the mixed film stage, boundary conditions.

11. A method as claimed in claim 7 wherein said computer aided design procedure is a finite element analysis model procedure that requires two friction parameter values and one of said two friction parameter values is said selected friction parameter value and the other friction parameter value is also selected to be in said mixed film stage; and said finite element analysis uses said two friction parameter values to provide improved correlation between estimated performance of the tooling geometry based on the finite element analysis and actual tooling performance as used in the metal forming operation.

12. A computer aided design method for producing a metal-based tooling for forming a specific part from a metal blank material in a metal forming operation that uses a lubricant,
said method comprising
determining changing values of a friction parameter through the mixed film stage of the lubricant as used with the metal blank material and the metal-based tooling;
based on said changing values of said friction parameter, selecting a value of said friction parameter representative of the mixed film stage of the lubricant;
providing computer aided design input information including a tooling material, a blank material specification and said selected friction parameter value;
generating an initial tooling geometry for producing the particular metal part using said computer aided design input information in combination with a computer aided design procedure; and
using said generated initial tooling geometry and the tooling material specification to produce the tooling.

13. A method as claimed in claim 12 wherein said friction parameter value is a coefficient of friction representative of the mixed film range of the lubricant as used in the method.

14. A method as claimed in claim 12 wherein said mixed film stage of the lubricant includes boundary conditions of the lubricant.

15. A method as claimed in claim 12 wherein said computer aided design procedure is a finite element analysis procedure that utilizes two friction parameter values of the lubricant with one of said two friction parameter values being said selected friction parameter value and the other friction parameter value being a second value in said mixed film stage of the lubricant.

16. A system for generating a metal forming tooling comprising
a computer aided design software system operating on a computer and including a friction parameter value known to be representative of the mixed film stage of a lubricant specified for a manufacturing process that uses the metal forming tooling of a specific material to produce a product from a metal based blank of a specific material, said computer aided design software utilizing the friction parameter value of the lubricant, the specific tooling material and the specific material of the metal based blank to generate initial geometry of the metal forming tooling; and
an automated system that utilizes the initial geometry of the metal forming tooling to generate the tooling of the known material.

17. A system as claimed in claim 16 including test equipment for determining frictional characteristics of the lubricant with respect to the specific material of the metal forming tooling and the specific material of the metal based blank where said test equipment provides detailed information of the mixed film stage and the range of the mixed film stage, and a statistical based processor that based on said detailed information generates said friction parameter value used in said computer aided design software system.

18. A system as claimed in claim 17 wherein said computer aided design software system utilizes a finite element analysis procedure to generate said initial metal forming tooling geometry.

19. A system as claimed in claim 16 wherein said friction parameter value is approximately an average value of the mixed film range of the lubricant.

20. A system as claimed in claim 16 wherein said friction parameter is statistically determined to be representative of the mixed film range of the lubricant or the mixed film range of the lubricant extended to include the boundary stage associated with the mixed film range or representative of the mixed film stage of the lubricant or the mixed film stage and boundary stage of the lubricant.

* * * * *